(12) United States Patent
Nakamura

(10) Patent No.: US 6,392,582 B1
(45) Date of Patent: May 21, 2002

(54) SEMICONDUCTOR INTEGRATED CIRCUIT

(75) Inventor: Hiroyuki Nakamura, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/662,605

(22) Filed: Sep. 14, 2000

Related U.S. Application Data

(62) Division of application No. 09/229,995, filed on Jan. 14, 1999, now Pat. No. 6,150,967.

(30) Foreign Application Priority Data

Jan. 21, 1998 (JP) .............................. 10-009429

(51) Int. Cl.[7] .............................................. H03M 1/12
(52) U.S. Cl. ...................................... 341/155; 341/137
(58) Field of Search ................................ 341/155, 135, 341/144, 143

(56) References Cited

U.S. PATENT DOCUMENTS

| | | | |
|---|---|---|---|
| 4,379,285 A | 4/1983 | Dooley | 340/347 |
| 5,729,122 A | 3/1998 | Nakamura | 323/315 |
| 5,966,087 A | 10/1999 | Koifman et al. | 341/155 |
| 6,150,967 A * | 11/2000 | Nakamura | 341/135 |

FOREIGN PATENT DOCUMENTS

EP  2695523 A  11/1994

* cited by examiner

*Primary Examiner*—Brian Young
(74) *Attorney, Agent, or Firm*—Fitzpatrick, Cella, Harper & Scinto

(57) ABSTRACT

This invention includes a current output sensor, and a current AD conversion means which is connected to the output side of the current output sensor and has a current mirror circuit arranged on the input side of a comparator in order to directly A/D-convert an output from the current output sensor. A signal can be stably processed with a small circuit scale and low current consumption.

2 Claims, 5 Drawing Sheets

SEMICONDUCTOR INTEGRATED CIRCUIT

This application is a division of application Ser. No. 09/229,995, filed Jan. 14, 1999, now U.S. Pat. No. 6,150,969.

BACKGROUND OF THE INVENTION

1. Field of the Invention

The present invention relates to a semiconductor integrated circuit and, more particularly, to a semiconductor integrated circuit having a current output sensor and a means for processing an output signal from the current output sensor.

2. Related Background Art

An output signal from a current output sensor is conventionally processed by a circuit having an arrangement shown in FIG. 1. Referring to FIG. 1, the current output sensor is a photodiode.

Referring to FIG. 1, a current output from a photodiode 1 must have a dynamic range of about 80 dB or more from a dark state to a bright state. When this current signal is processed by, e.g., a 5-V single power source, the signal is first logarithmically compressed by an operational amplifier 23 and a diode 33. An output $V_{o1}$ from the operational amplifier 23 is $$V_{O1} = V_c - \frac{kT}{q} \ln \frac{I_{OP}}{I_{S1}} \quad (1)$$

where $V_C$ is the reference voltage, $I_{S1}$ is the reverse saturation current of the photodiode, and $I_{OP}$ is the output current from the photodiode.

The output $V_{O1}$ is changed into an output $V_{O2}$ by a transistor 43 for compensating a dark current. The output $V_{O2}$ is $$V_{O2} = V_{O1} + \frac{kT}{q} \ln \frac{I_B}{I_{S2}} \quad (2)$$

where $I_B$ is the value of a constant current 53, and $I_{S2}$ is the reverse saturation current of the transistor 43.

The output $_{O2}$ is therefore $$V_{O2} = V_C - \frac{kT}{q} \ln \left( \frac{I_{OP}}{I_B} \cdot \frac{I_{S2}}{I_{S1}} \right) \quad (3)$$

For $I_{S1} = I_{S2}$ $$V_{O2} = V_C - \frac{kT}{q} \ln \frac{I_{OP}}{I_B} \quad (4)$$

Referring to FIG. 1, a buffer 63 changes the impedance. An operational amplifier 93 adjusts a signal to an input range for an AD (analog-to-digital) converter in cooperation with resistors 73 and 83. An output $V_O$ from the operational amplifier 93 is $$V_O = V_C - \frac{R_2}{R_1} \cdot \frac{kT}{q} \ln \frac{I_{OP}}{I_B} \quad (5)$$

where $R_1$ is the value of the resistor 73, and $R_2$ is the value of the resistor 83. This output $V_O$ is A/D-converted and then transmitted to a CPU or the like.

In the conventional circuit, however, a plurality of circuit blocks such as an operational amplifier, constant current source, reference power source, and AD converter are required to process an output signal from the current output sensor. This increases the number of elements and the power consumption, resulting in a large chip size and high cost.

SUMMARY OF THE INVENTION

The present invention has been made in consideration of the above situation, and has as its object to process an output from a current output sensor with a smaller number of elements (simple circuit arrangement).

It is another object of the present invention to provide a semiconductor integrated circuit which can directly A/D-convert a current to achieve high-speed operation at low cost with a simpler circuit arrangement without any current-to-voltage conversion (logarithmic compression), impedance conversion, and gain adjustment.

To achieve the above objects, according to the present invention, there is provided a semiconductor integrated circuit comprising a current output sensor, and current AD conversion means connected to an output side of the current output sensor to connect an output from the current output sensor to an input side of a comparator via a current mirror circuit and A/D (analog-to-digital)-convert the output from the current output sensor.

DETAILED DESCRIPTION OF THE PREFERRED EMBODIMENT

An embodiment of the present invention will be described in detail below with reference to the accompanying drawings.

Figure 1:
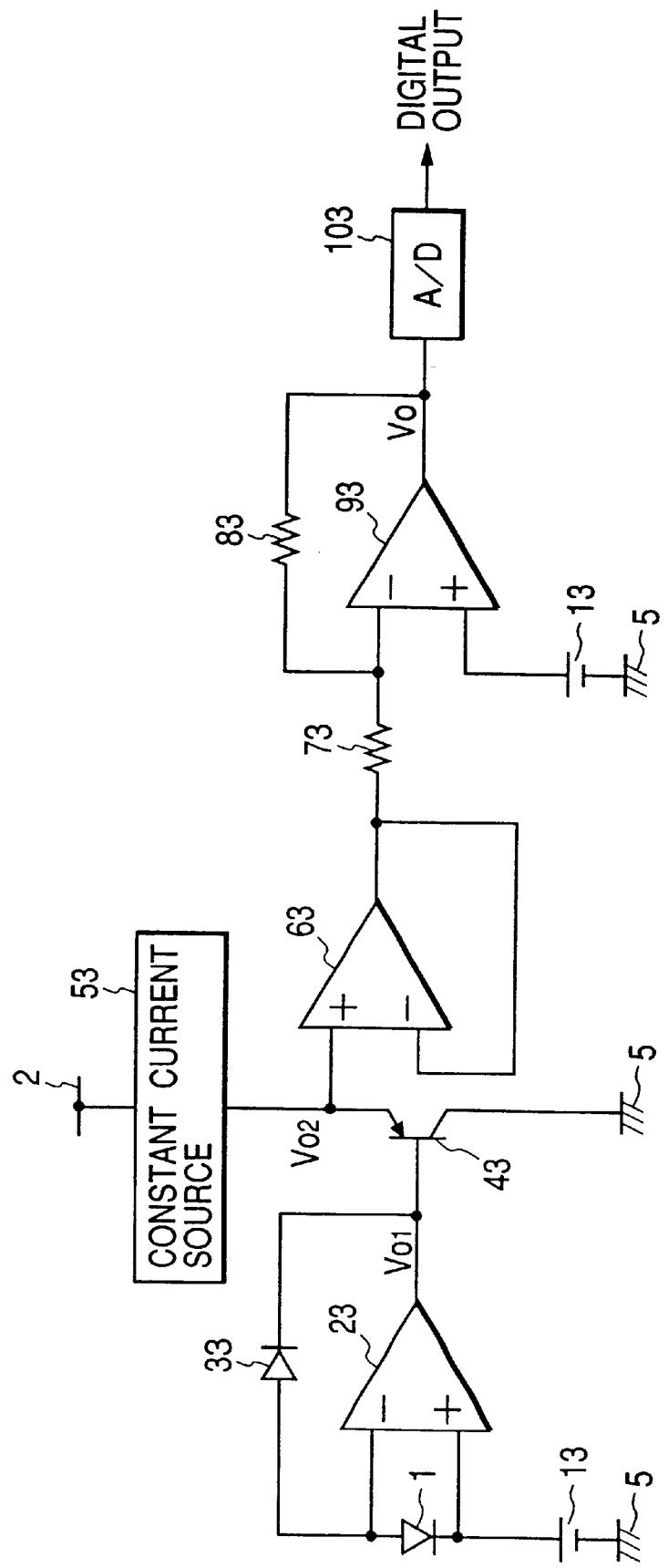
FIG. 1 is a schematic circuit diagram showing an example of a signal processing circuit using a current output sensor.
Figure 2:
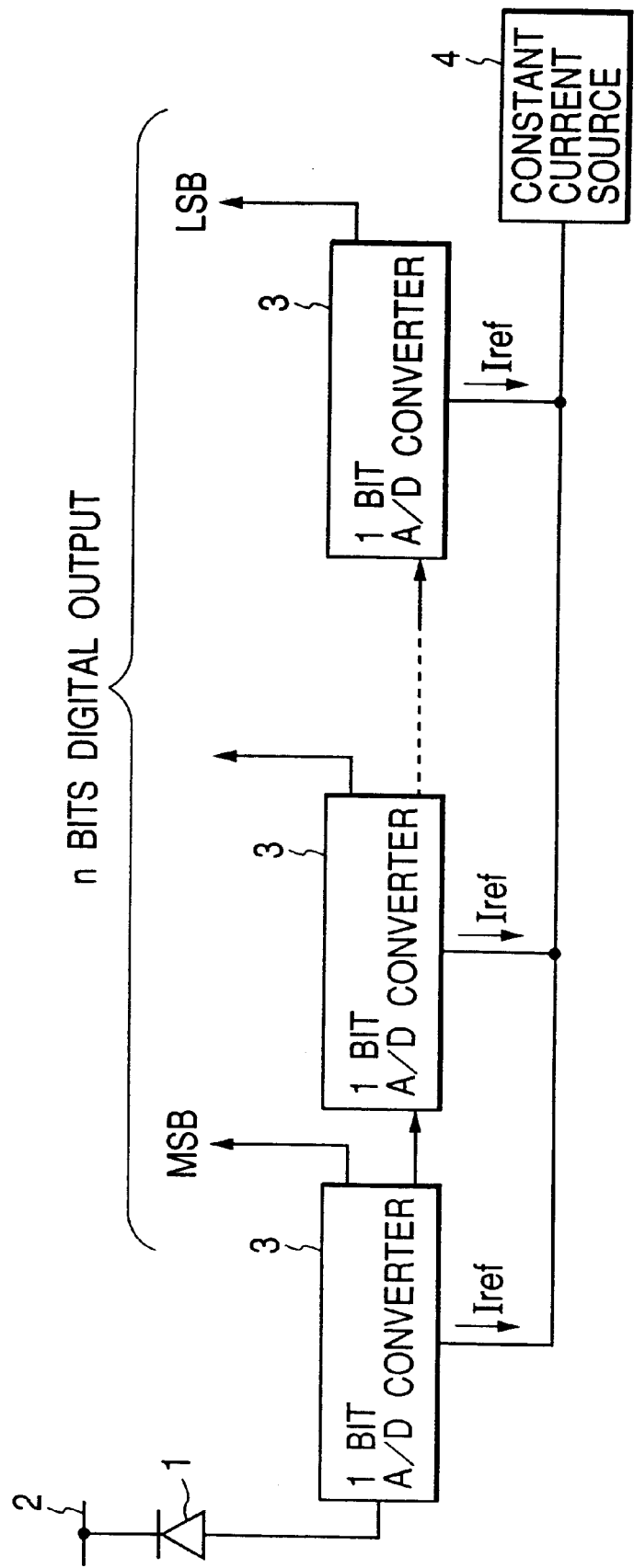
FIG. 2 is a schematic block diagram for explaining an example of a semiconductor integrated circuit according to the present invention.

FIG. 2 is a block diagram showing a semiconductor integrated circuit according to an embodiment of the present invention. Referring to FIG. 2, the semiconductor integrated circuit comprises a current output sensor 1 such as a photodiode or phototransistor (in this embodiment, a photodiode), a power source 2, 1-bit current input AD converters 3, and a constant current source 4 for generating a reference current.

Figure 3:
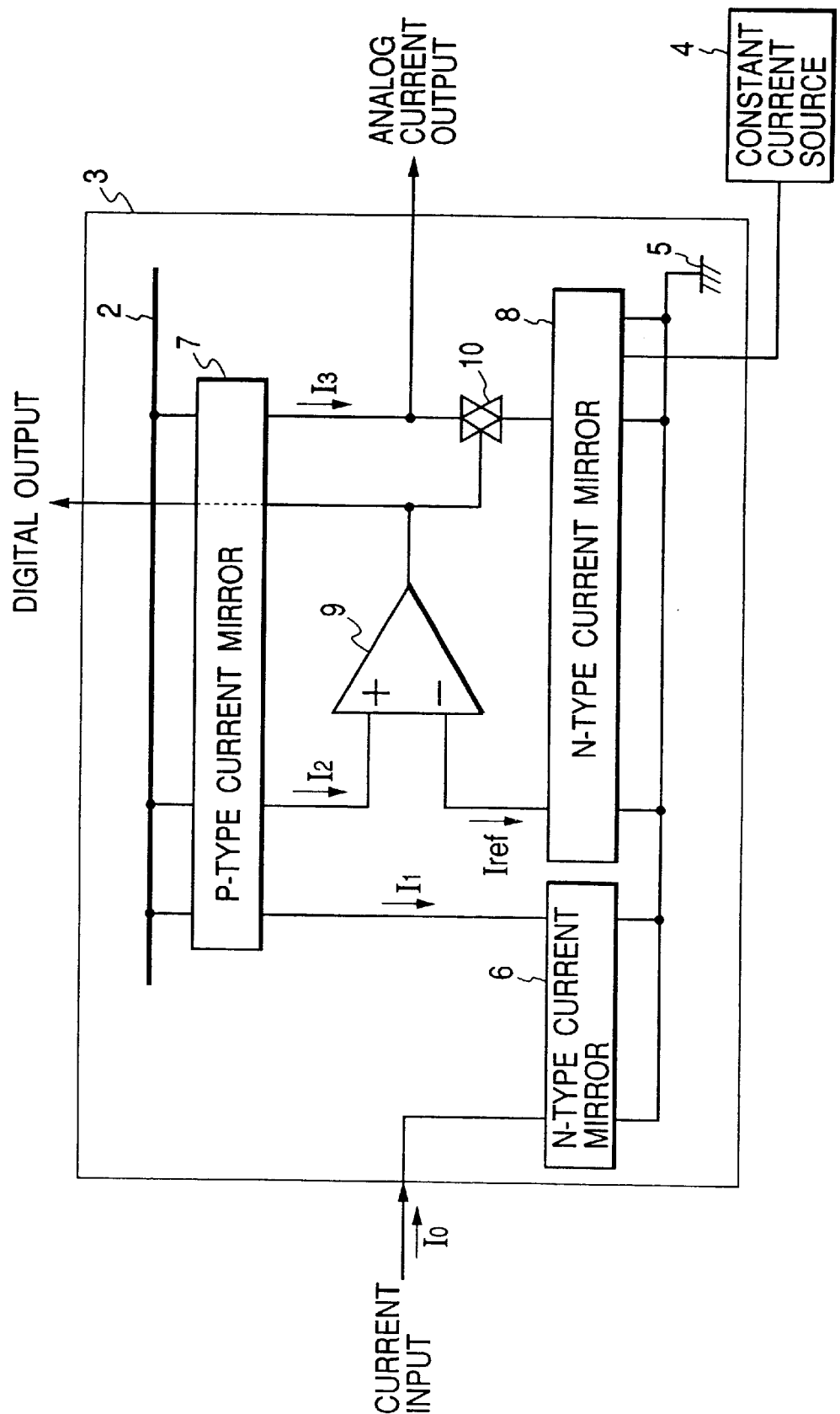
FIG. 3 is a schematic block diagram for explaining an example of an AD converter according to the present invention.
Figure 4:
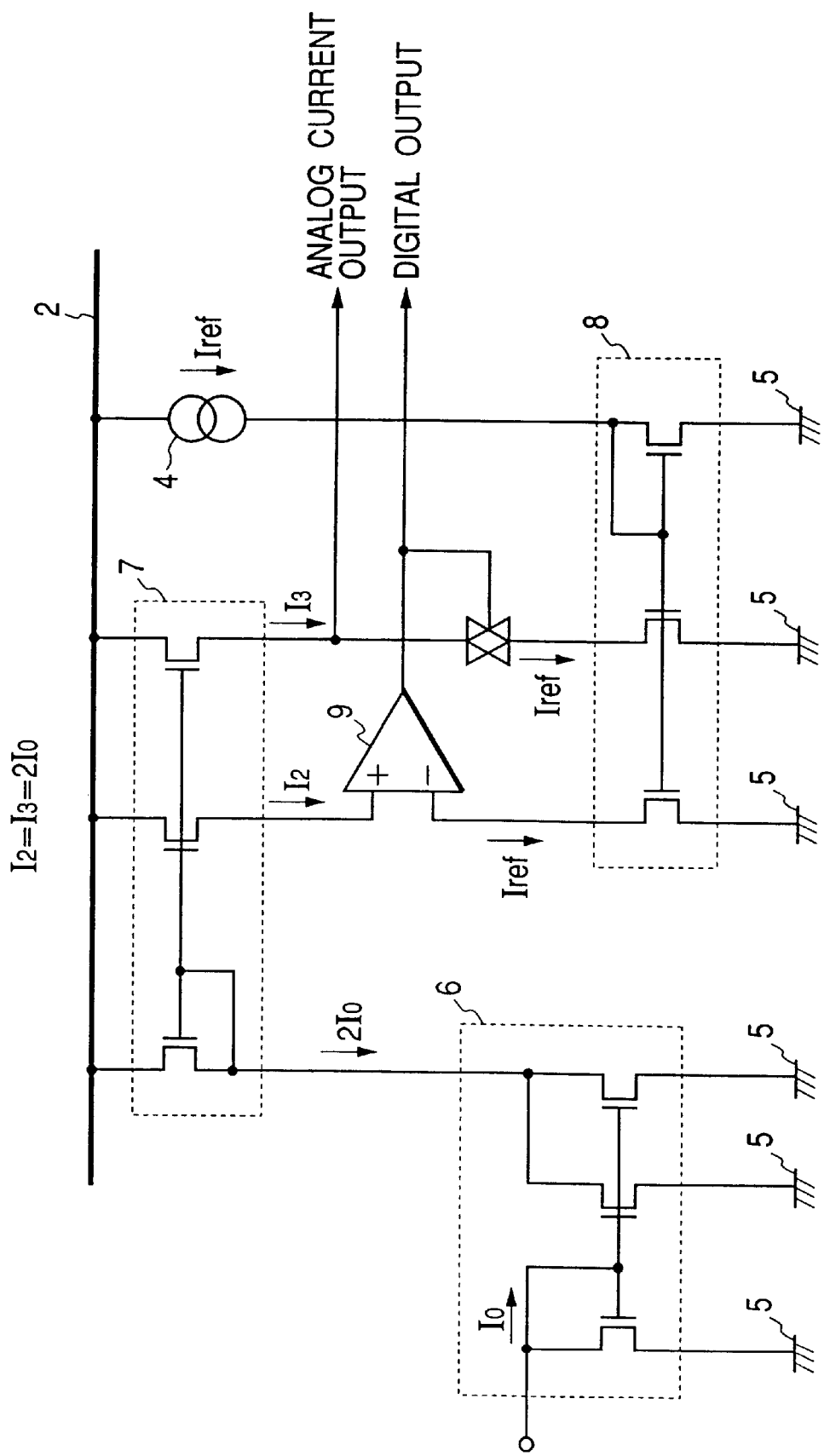
FIG. 4 is a schematic circuit diagram for explaining the example of the AD converter.

FIG. 3 is a schematic block diagram showing an example of each 1-bit current input AD converter 3 in FIG. 2. Referring to FIG. 3, the 1-bit current input AD converter 3 is constituted by an N-type current mirror circuit 6 for receiving an input signal current, a P-type current mirror circuit 7 for receiving an output from the N-type current mirror circuit 6, an N-type current mirror circuit 8 connected to the constant current source 4 to generate a comparison reference current for each 1-bit current input AD converter 3, a current comparator 9 for comparing an output from the P-type current mirror circuit 7 with an output from the N-type current mirror circuit 8 for generating a comparison reference current, and an analog switch 10 controlled by an output from the current comparator 9. FIG. 4 is a circuit diagram showing an example of the detailed arrangement of the circuit in FIG. 3.

In this arrangement, when an output current $I_O$ from the current output sensor 1 is input to the N-type current mirror circuit 6, the P-type current mirror 25 circuit 7 is driven by an output current $I_1$ from the N-type current mirror circuit 6. As shown in FIG. 4, a signal current generated by the P-type current mirror circuit 7 is connected to the outputs of two transistors equal in size on the connection side of the N-type current mirror circuit 6 to the P-type current mirror circuit 7, and set to $2 \times I_O$ to attain $I_2 = 2 \times I_O$ and $I_3 = 2 \times I_O$. $I_2$ is input to the current comparator 9 together with a reference current $I_{ref}$ generated by the N-type current mirror circuit 8. The current comparator 9 outputs "1" for $I_2 \geq I_{ref}$ "0" for $I_2 < I_{ref}$ When the current comparator 9 outputs "1", the analog switch 10 is turned on to input to a succeeding 1-bit current input AD converter a current difference $\Delta I$ between the signal current $I_3$ and the reference current $I_{ref}$:

$$\Delta = I_3 - I_{ref}$$

When the current comparator 9 outputs "0", the analog switch 10 is turned off to input the signal current $I_3$ (=$I_2$) to a succeeding 1-bit current input AD converter.

To obtain an n-bit AD conversion output, n 1-bit current input AD converters set to the same reference current (including substantially the same reference current) are series-connected, and sequentially perform the above operation while doubling a current input to each 1-bit AD converter. The same result can also be obtained by reducing the reference current to ½ from an MSB (Most Significant Bit) without doubling the input current by the P-type current mirror circuit 7. However, the integrated circuit is more advantageous in doubling the input current by the P-type current mirror circuit 7 because the same cell can be used. When the reference current is reduced to ½, only one transistor is arranged on the output side of the N-type current mirror circuit 6. The N and P types of the current mirror circuits can be reversed.

Figure 5:
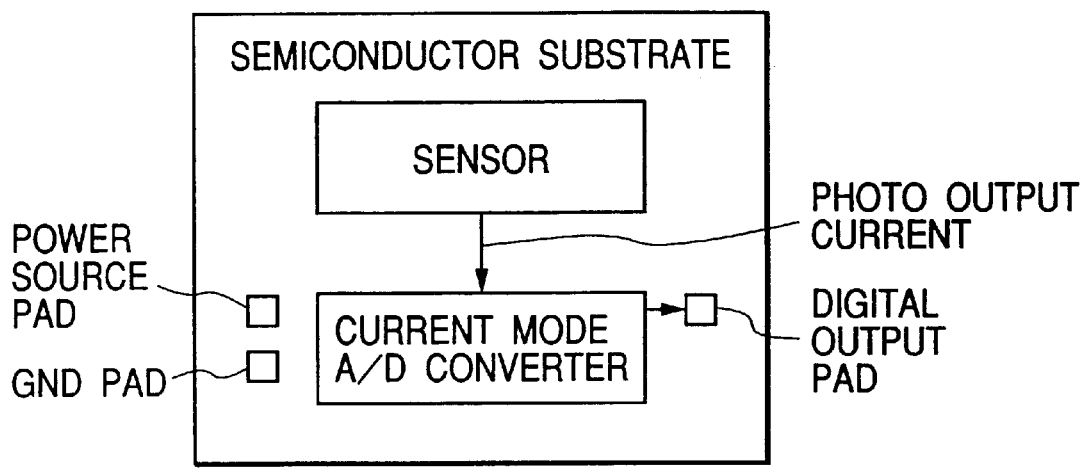
FIGS. 5 and 6 are schematic layout views for explaining examples of the layout of functional elements on a semiconductor substrate.
Figure 6:
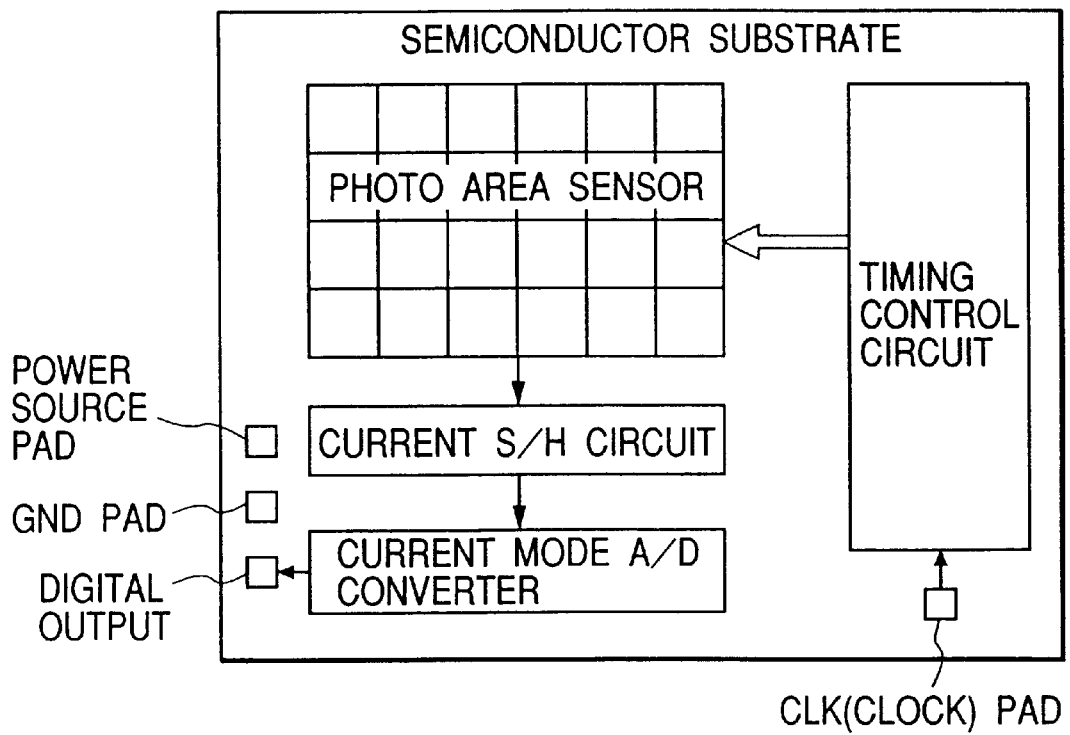

The semiconductor integrated circuit of this embodiment is formed on a single semiconductor substrate. FIG. 5 is a schematic view showing an example of the layout in which one sensor (photodiode) and n-bit current input AD converters are formed on the same semiconductor substrate. FIG. 6 is a schematic view showing an example of the layout in which a photo area sensor (constituted by arranging photodiodes in a matrix), a timing control circuit, a current sampling/holding (S/H) circuit, and n-bit current input AD converters are formed on the same semiconductor substrate.

As has been described above, according to the present invention, an output current from the current output sensor is directly connected to the current AD conversion means, which can simplify the circuit arrangement and can decrease the number of elements and the power consumption.

The current output sensor can be directly series-connected to n 1-bit current input AD converters to obtain an n-bit digital output, thereby greatly reducing the number of elements, the power consumption, the chip size, and the cost.

Further, according to the present invention, a simple current input AD converter can be realized to facilitate the chip design and decrease the power consumption.

What is claimed is:

1. A semiconductor integrated circuit comprising:

a photosensor for outputting a signal current;

a current sample and hold circuit for sampling and holding the signal current at a particular timing;

a current A/D converter which converts the signal current held by said current sample and hold circuit into a digital signal corresponding to the signal current, said current A/D converter performing its A/D conversion based on said particular timing.

2. A circuit according to claim 1, wherein said photosensor is an area sensor.

* * * * *

UNITED STATES PATENT AND TRADEMARK OFFICE
CERTIFICATE OF CORRECTION

PATENT NO. : 6,392,582 B1
DATED : May 21, 2002
INVENTOR(S) : Hiroyuki Nakamura

It is certified that error appears in the above-identified patent and that said Letters Patent is hereby corrected as shown below:

Column 1,
Lines 4-5, "No. 6,150,969" should read -- No. 6,150,967 --.

Column 3,
Line 25, "$\Delta = I_3 - I_{ref}$" should read -- $\Delta I = I_3 - I_{ref}$ --.

Signed and Sealed this

Eighteenth Day of February, 2003

JAMES E. ROGAN
*Director of the United States Patent and Trademark Office*